United States Patent
Chuang et al.

(10) Patent No.: US 11,569,687 B2
(45) Date of Patent: Jan. 31, 2023

(54) DECODER FOR WIRELESS CHARGING TRANSMITTER AND WIRELESS CHARGING TRANSMITTER USING THE SAME

(71) Applicant: Generalplus Technology Inc., Hsinchu (TW)

(72) Inventors: Down Xu Chuang, Zhunan Township, Miaoli County (TW); Chau-Chin Chuang, Hsinchu (TW); Tung-Tsai Liao, Hsinchu (TW)

(73) Assignee: GENERALPLUS TECHNOLOGY INC., Hsinchu (TW)

( * ) Notice: Subject to any disclaimer, the term of this patent is extended or adjusted under 35 U.S.C. 154(b) by 475 days.

(21) Appl. No.: 16/818,285

(22) Filed: Mar. 13, 2020

(65) Prior Publication Data
US 2020/0295605 A1 Sep. 17, 2020

(30) Foreign Application Priority Data
Mar. 13, 2019 (TW) .................................. 108108393

(51) Int. Cl.
*H02J 50/12* (2016.01)
*H02J 7/02* (2016.01)
*H03G 3/30* (2006.01)
*H03F 3/45* (2006.01)

(52) U.S. Cl.
CPC ................ *H02J 50/12* (2016.02); *H02J 7/02* (2013.01); *H03F 3/45* (2013.01); *H03G 3/30* (2013.01); *H03F 2203/45151* (2013.01)

(58) Field of Classification Search
CPC ...................................................... H02J 50/12
USPC .......................................................... 320/108
See application file for complete search history.

(56) References Cited

U.S. PATENT DOCUMENTS

2014/0240099 A1* 8/2014 Chuang .............. G06K 19/0703
340/10.5

* cited by examiner

*Primary Examiner* — Eric D Lee
(74) *Attorney, Agent, or Firm* — Muncy, Geissler, Olds & Lowe, P.C.

(57) ABSTRACT

A decoder for a wireless charging transmitter and a wireless charging transmitter using the same are provided in the present invention. In order to adapt the wide range of the received signal from the wireless charging receiver, which usually results in the error of the decode, the feedback circuit of the wireless charging transmitter is changed, so that the signal in a certain swing is amplified by an original gain, and the signal out of the certain swing is amplified by a limited gain. Therefore, the amplified signal is able to show the characteristic of the original received signal. Thus, the accuracy of decoding is increased.

20 Claims, 11 Drawing Sheets

DECODER FOR WIRELESS CHARGING TRANSMITTER AND WIRELESS CHARGING TRANSMITTER USING THE SAME

This application claims priority to 108108393 filed on Mar. 13, 2019 which is incorporated herein by reference in its entirety.

BACKGROUND OF THE INVENTION

Field of the Invention

The present invention relates to the wireless charging technology, and more particularly to a decoder for wireless charging transmitter and a wireless charging transmitter using the same.

Description of the Related Art

In QI wireless charging product, WPC (Wireless Power Consortium) defines that the wireless charging receiver Rx performs two-way communication with wireless charging transmitter. The wireless charging transmitter adopts FSK (Frequency Shift Keying) protocol to transmit data to the wireless charging receiver, The wireless charging receiver adopts ASK (Amplitude Shift Keying) protocol to transmit data to the wireless charging transmitter.

FSK protocol in wireless charge is that wireless charging transmitter changes the frequency of the transmitting signal according to data. The frequency range can be adjusted by the software of the wireless charging transmitter. QI standard also has the explanation of the frequency range, the wireless charging receiver can acquire the modulation signal from the demodulation circuit. The frequency of the receiving signal is sensed by the coil of the wireless charging receiver which is closed to the coil of the wireless charging transmitter. QI standard also discloses its decoder circuit.

In conventional art, the amplifier and comparator (or SCHMITT trigger circuit) are adopted to change the analog signal to a square wave signal, and then the square wave signal can be decoded by software of the wireless charging receiver. However, since the dynamic range of the signal of the wireless charging system is quite wide, depending on one gain value to adopt all of the status of the signal is not easy to achieve the above circuit function. Thus, in order to increase the successful decoding rate, a plurality of amplifiers with different gain values and a plurality of comparators should be adopted to obtain a wider dynamic range. Further, due to a comparator for digitizing the signal, the decoding program in the rear side is difficult to process if the signal is triggered incorrectly, and decoding errors would occur. Thus, the successful decoding rate is reduced.

SUMMARY OF THE INVENTION

An objective of the present invention is to provide a decoder for a wireless charging transmitter and a wireless charging transmitter using the same. According to the design of the feedback circuit, the initial stage amplifier can have wider dynamic range. Thus, the successful decoding rate is increased.

In view of this, the present invention provides a decoder for a wireless charging transmitter, the decoder for a wireless charging transmitter includes an operational amplifier, a gain limitation feedback circuit, and a comparator circuit. The operational amplifier includes a first input terminal, a second input terminal and an output terminal, wherein the first input terminal of operational amplifier is coupled to a charge detecting terminal of a wireless charging transmitter, and the output terminal of operational amplifier outputs an amplifying signal. The gain limitation feedback circuit is coupled to the output terminal of the operational amplifier, and selectively coupled to the first input terminal or the second terminal of the operational amplifier, for limiting a gain of the operational amplifier, wherein the operational amplifier is operated at a first gain when a swing of the amplifying signal is between a first threshold voltage and a second threshold voltage, wherein the operational amplifier is operated at a second gain when the swing of the amplifying signal is greater than the first threshold voltage or smaller than a second threshold voltage. The comparator circuit is for receiving a sampled DC voltage and the amplifying signal, and obtaining a decoded data according to the sampled DC voltage and the amplifying signal.

The present invention additionally provides a wireless charging transmitter. The wireless charging transmitter includes a wireless transmitter circuit and a decoder for wireless charging transmitter. The wireless transmitter circuit is for transmitting a wireless charge power signal and receiving a receiving signal, comprising a charge detecting terminal. The decoder for wireless charging transmitter includes an operational amplifier, a gain limitation feedback circuit, and a comparator circuit. The operational amplifier includes a first input terminal, a second input terminal and an output terminal, wherein the first input terminal of operational amplifier is coupled to a charge detecting terminal of a wireless charging transmitter, and the output terminal of operational amplifier outputs an amplifying signal. The gain limitation feedback circuit is coupled to the output terminal of the operational amplifier, and selectively coupled to the first input terminal or the second terminal of the operational amplifier, for limiting a gain of the operational amplifier, wherein the operational amplifier is operated at a first gain when a swing of the amplifying signal is between a first threshold voltage and a second threshold voltage, wherein the operational amplifier is operated at a second gain when the swing of the amplifying signal is greater than the first threshold voltage or smaller than a second threshold voltage. The comparator circuit is for receiving a sampled DC voltage and the amplifying signal, and obtaining a decoded data according to the sampled DC voltage and the amplifying signal.

In the decoder for a wireless charging transmitter and the wireless charging transmitter using the same according to the preferred embodiment of the present invention, the gain limitation feedback circuit includes a first unidirectional conduction element, a second unidirectional conduction element, a first resistor and a second resistor. The first unidirectional conduction element includes a first terminal and a second terminal, wherein the first terminal of the first unidirectional conduction element is coupled to the first input terminal of the operational amplifier, and the second terminal of the first unidirectional conduction element is coupled to the output terminal of the operational amplifier, wherein the first unidirectional conduction element limits current flowing from the first terminal of the first unidirectional conduction element to the second terminal of the first unidirectional conduction element. The second unidirectional conduction element includes a first terminal and a second terminal, wherein the second terminal of the second unidirectional conduction element is coupled to the first input terminal of the operational amplifier, and the first terminal of the second unidirectional conduction element is coupled to the output terminal of the operational amplifier, wherein the second unidirectional conduction element limits current flowing from the first terminal of the second unidirectional conduction element to the second terminal of the second unidirectional conduction element. The first resistor includes a first terminal and a second terminal, wherein the first terminal of the first resistor is coupled to the charge detecting terminal, and the second terminal of the first resistor is coupled to the first input terminal of the operational amplifier. The second resistor includes a first terminal and a second terminal, wherein the first terminal of the second resistor is coupled to the first input terminal of the operational amplifier, and the second terminal of the second resistor is coupled to the output terminal of the operational amplifier, wherein the first unidirectional conduction element has a first cut-in voltage, and the second unidirectional conduction element has a second cut-in voltage, wherein the first cut-in voltage and the second cut-in voltage are respectively for determining the first threshold voltage and the second threshold voltage, wherein the second input terminal of the operational amplifier is coupled to a DC bias voltage.

In the decoder for a wireless charging transmitter and the wireless charging transmitter using the same according to the preferred embodiment of the present invention, the decoder for wireless charging transmitter further includes a current sense circuit, coupled to the first input terminal of the operational amplifier, and the charge detecting terminal. In a preferred embodiment of the present invention, the gain limitation feedback circuit includes a first DC blocking capacitor, a first unidirectional conduction element, a second unidirectional conduction element, a first resistor, a second resistor and an AC impedance circuit. The first DC blocking capacitor includes a first terminal and a second terminal, wherein the first terminal of the first DC blocking capacitor is coupled to the second input terminal of the operational amplifier. The first unidirectional conduction element includes a first terminal and a second terminal, wherein the first terminal of the first unidirectional conduction element is coupled to the second terminal of the first DC blocking capacitor, and the second terminal of the first unidirectional conduction element is coupled to the output terminal of the operational amplifier, wherein the first unidirectional conduction element limits current flowing from the first terminal of the first unidirectional conduction element to the second terminal of the first unidirectional conduction element. The second unidirectional conduction element includes a first terminal and a second terminal, wherein the second terminal of the second unidirectional conduction element is coupled to the second terminal of the first DC blocking capacitor, and the first terminal of the second unidirectional conduction element is coupled to the output terminal of the operational amplifier, wherein the second unidirectional conduction element limits current flowing from the first terminal of the second unidirectional conduction element to the second terminal of the second unidirectional conduction element. The first resistor includes a first terminal and a second terminal, wherein the first terminal of the first resistor is coupled to a common voltage, and the second terminal of the first resistor is coupled to the second input terminal of the operational amplifier. The second resistor includes a first terminal and a second terminal, wherein the first terminal of the second resistor is coupled to the second terminal of the first resistor, and the second terminal of the second resistor is coupled to the output terminal of the operational amplifier. The AC impedance circuit includes a first terminal and a second terminal, wherein the first terminal of the AC impedance circuit is coupled to the second input terminal of the operational amplifier, and the second terminal of the AC impedance circuit is coupled to the common voltage, wherein the first resistor and the second resistor determines a DC gain, wherein the first resistor, the second resistor and the AC impedance circuit determines the first gain, wherein the first unidirectional conduction element has a first cut-in voltage, and the second unidirectional conduction element has a second cut-in voltage, wherein the first cut-in voltage and the second cut-in voltage respectively determines the first threshold voltage and the second threshold voltage.

In the decoder for a wireless charging transmitter and the wireless charging transmitter using the same according to the preferred embodiment of the present invention, the decoder for wireless charging transmitter further includes a second DC blocking capacitor and a DC sampling circuit. The second DC blocking capacitor includes a first terminal and a second terminal, wherein the first terminal of the second DC blocking capacitor is coupled to the output terminal of the operational amplifier, and the second terminal of the second DC blocking capacitor outputs the amplifying signal. The DC sampling circuit includes an input terminal and an output terminal, wherein the input terminal of the DC sampling circuit is coupled to the output terminal of the operational amplifier, the output terminal of the DC sampling circuit outputs the sampled DC voltage.

In the decoder for a wireless charging transmitter and the wireless charging transmitter using the same according to the preferred embodiment of the present invention, the AC impedance circuit includes a third resistor and a third DC blocking capacitor. The third resistor includes a first terminal and a second terminal, wherein the first terminal of the third resistor is coupled to the second input terminal of the operational amplifier. The third DC blocking capacitor includes a first terminal and a second terminal, wherein the first terminal of the third DC blocking capacitor is coupled to the second terminal of the third resistor, and the second terminal of the second DC blocking capacitor is coupled to the common voltage.

In the decoder for a wireless charging transmitter and the wireless charging transmitter using the same according to the preferred embodiment of the present invention, the DC sampling circuit includes a fourth resistor, a fifth resistor and a first capacitor. The fourth resistor includes a first terminal and a second terminal, wherein the first terminal of the fourth resistor is coupled to the output terminal of the operational amplifier. The fifth resistor includes a first terminal and a second terminal, wherein the first terminal of the fifth resistor is coupled to the second terminal of the fourth resistor, and the second terminal of the fifth resistor is coupled to the common voltage. The first capacitor includes a first terminal and a second terminal, wherein the first terminal of the first capacitor is coupled to the second terminal of the fourth resistor, and the second terminal of the first capacitor is coupled to the common voltage.

The present invention additionally provides a decoder for wireless charging transmitter. The decoder for wireless charging transmitter includes a signal limitation circuit and a comparator circuit. The signal limitation circuit includes an input terminal and an output terminal, wherein the input terminal of the signal limitation circuit is coupled to a charge detecting terminal of a wireless charging transmitter, and the output terminal of the signal limitation circuit outputs an amplifying signal, wherein the signal limitation circuit operates at a first gain when a swing of the amplifying signal is between the first threshold voltage and the second threshold voltage, wherein the signal limitation circuit operates at a second gain when the swing of the amplifying signal is greater than the first threshold voltage or smaller than the second threshold voltage, wherein the second gain is smaller than the first gain. The comparator circuit is for receiving a sampled DC voltage and the amplifying signal, and obtaining a decoded data according to the sampled DC voltage and the amplifying signal.

The essence of the present invention is to change the gain of the circuit. When the swing of the signal is under a preset swing, the gain of the circuit adopts an original gain, and when the swing of the signal is greater than the preset swing, the gain is limited. Therefore, the operational amplifier has higher dynamic range. And, the amplifying signal still has the characteristic of the original signal. Thus, the successful decoding rate is increased.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

DETAILED DESCRIPTION OF THE INVENTION

Figure 1:
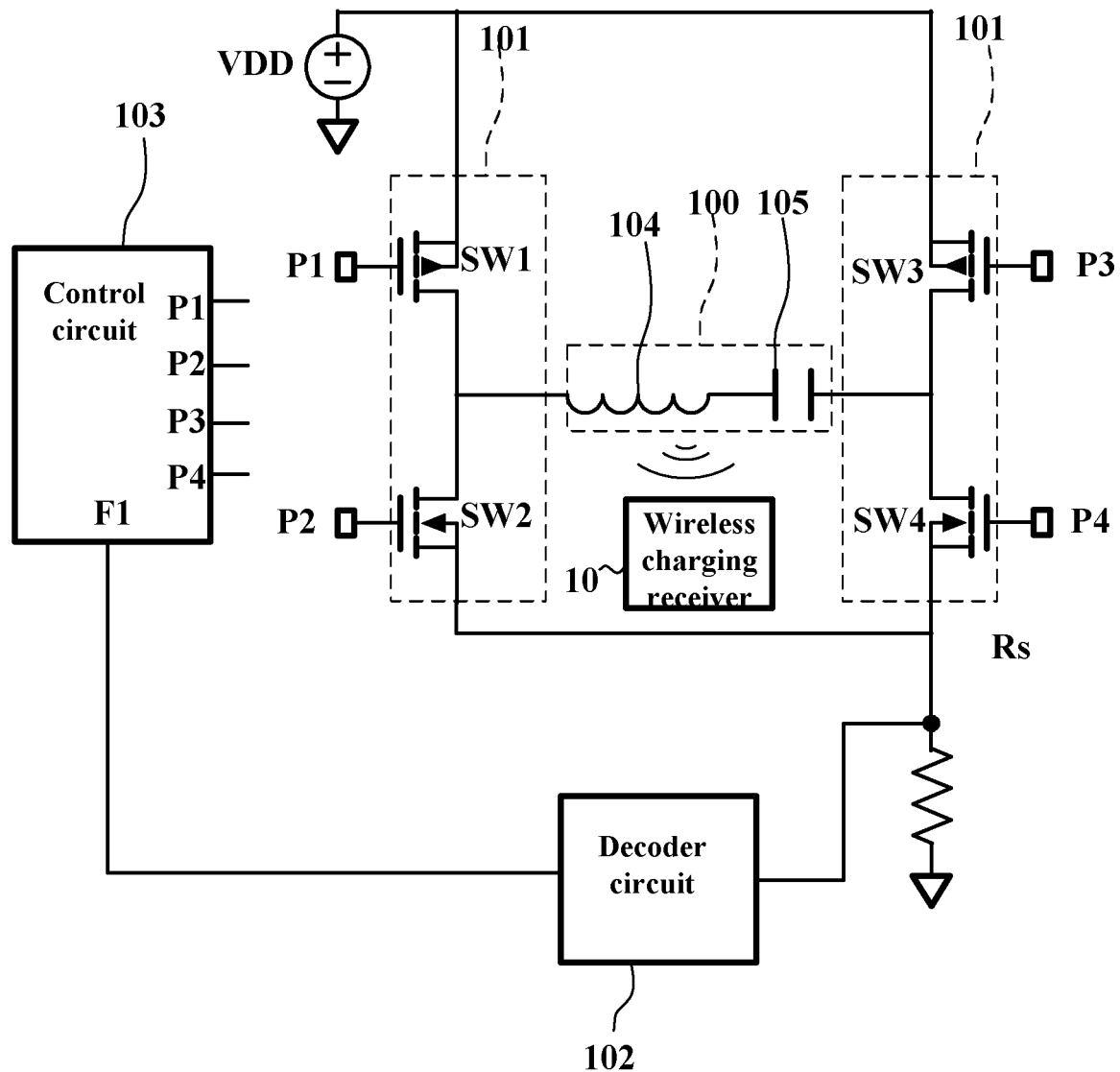
FIG. 1 illustrates a circuit diagram depicting a wireless charging transmitter according to a preferred embodiment of the present invention.

FIG. 1 illustrates a circuit diagram depicting a wireless charging transmitter according to a preferred embodiment of the present invention. Referring to FIG. 1, the wireless charging transmitter includes a resonant circuit 100, a switching circuit 101, a decoder circuit 102 and a control circuit 103. The resonant circuit 100 includes an inductor 104 and a capacitor 105. The resonant circuit 100 is for providing energy to the wireless charging receiver 10 according to the switching circuit 101. In this embodiment, the switching circuit 101 is implemented by a full bridge circuit, which includes four switches SW1~SW4. The gates of the switches SW1~SW4 are respectively coupled to the pins P1, P2, P3 and P4 of the control circuit 103. People having ordinary skill in the art should know that the switching circuit 101 can be implemented by two switches, such as half bridge circuit, and the detail description thereof is omitted. The decoder circuit 102 in this embodiment adopts a current decoder circuit to serve as an example, and its input terminal is coupled to the current sense resistor Rs coupled to the switch SW4. The output terminal of the decoder circuit 102 is coupled to the pin F1 of the control circuit 103, for decoding the voltage on the current sense resistor Rs which is from the wireless signal of the wireless power receiver. Thus, the control circuit 103 can obtain the feedback information from the wireless charging receiver 10.

Figure 2:
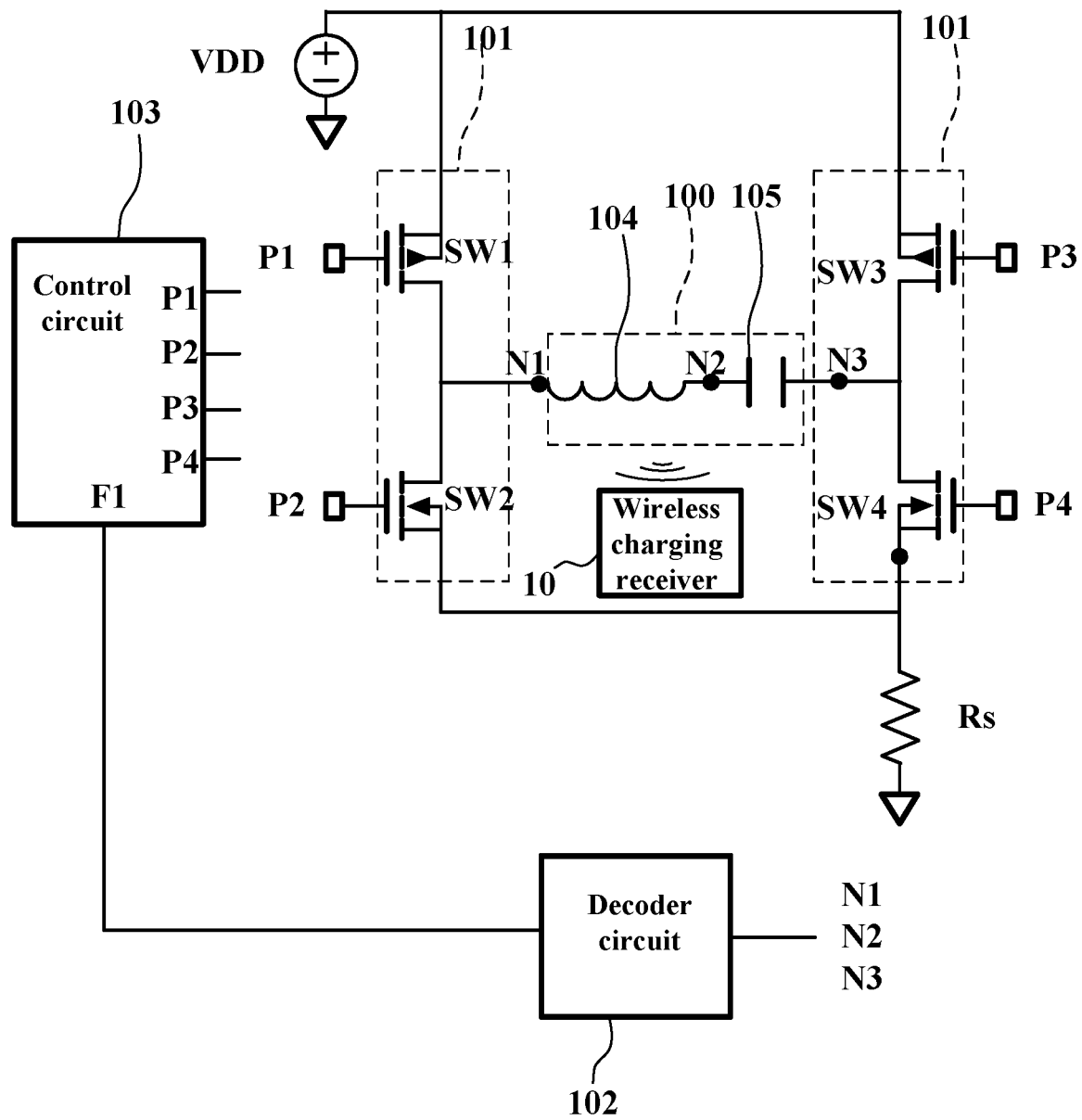
FIG. 2 illustrates a circuit diagram depicting a wireless charging transmitter according to a preferred embodiment of the present invention.

FIG. 2 illustrates a circuit diagram depicting a wireless charging transmitter according to a preferred embodiment of the present invention. Referring to FIG. 2, the wireless charging transmitter also includes a resonant circuit 100, a switching circuit 101, a decoder circuit 102 and a control circuit 104. However, the decoder circuit 102 in this embodiment is a voltage decoder circuit to serve as an example. The input terminal can be selectively coupled to the nodes N1, N2 or N3 of the resonant circuit 100. The decoder circuit 102 is for decoding the resonant voltage which is from the wireless signal of the wireless power receiver. Thus, the control circuit 103 can obtain the feedback information from the wireless charging receiver 10.

Figure 3A:
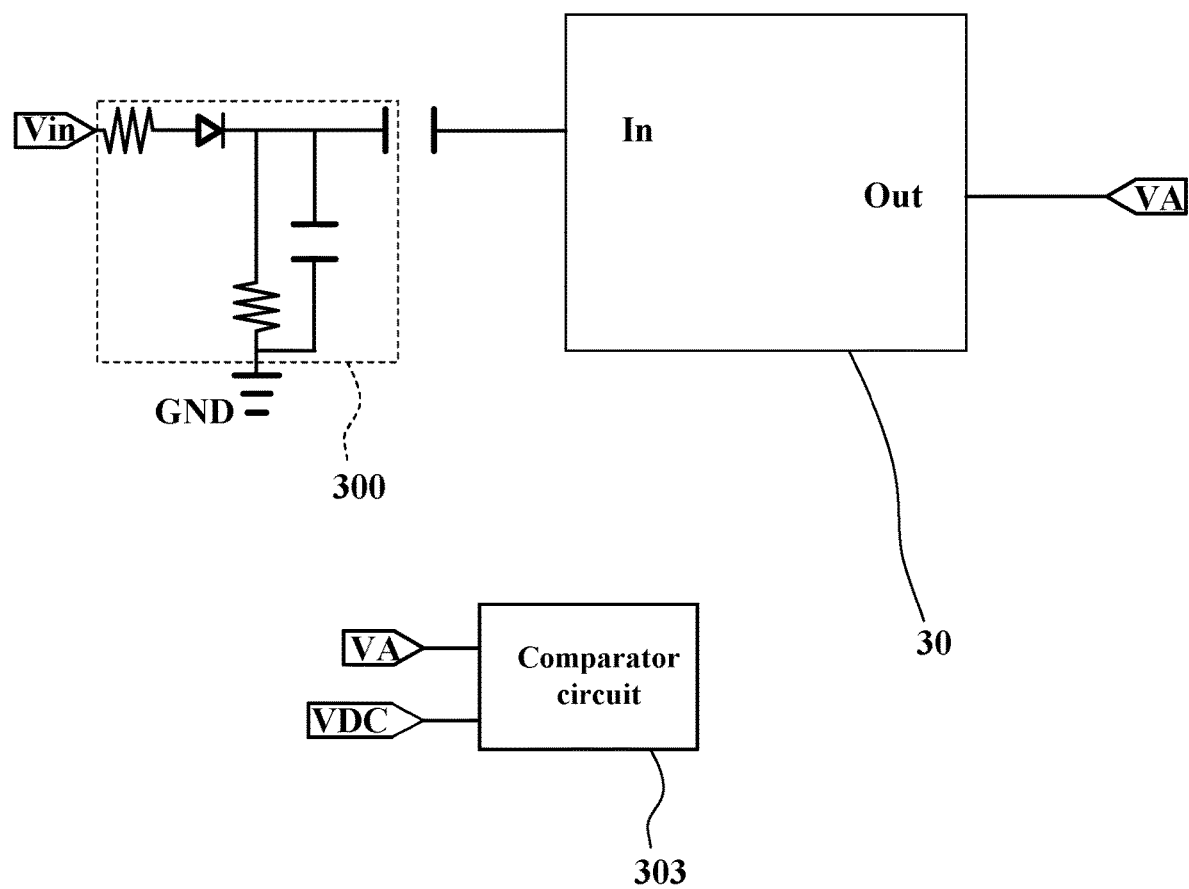
FIG. 3A illustrates a circuit diagram depicting decoder 102 for a wireless charging transmitter according to a preferred embodiment of the present invention.

FIG. 3A illustrates a circuit diagram depicting a decoder 102 for a wireless charging transmitter according to a preferred embodiment of the present invention. Referring to FIG. 3A, in this embodiment, the voltage decoder circuit in FIG. 2 is adopted to serve as an example. The decoder for a wireless charging transmitter 102 includes a voltage sampling circuit 300, a signal limitation circuit 30 and a comparator circuit 303. The signal limitation circuit 30 includes an input terminal In and an output terminal Out, wherein the input terminal In of the signal limitation circuit 30 is coupled to the charge detection terminal Vin of the wireless charging transmitter through the voltage sampling circuit 300, and the output terminal Out of the signal limitation circuit 30 outputs an amplifying signal VA. The function of the signal limitation circuit 30 is to limit the swing of the amplifying signal VA. When the swing of the amplifying signal VA is between the first threshold voltage and the second threshold voltage, the signal limitation circuit 30 operates at a higher gain value. When the swing of the amplifying signal VA is greater than a first threshold voltage or smaller than the second threshold voltage, the signal limitation circuit 30 operates at a lower gain value.

Figure 3B:
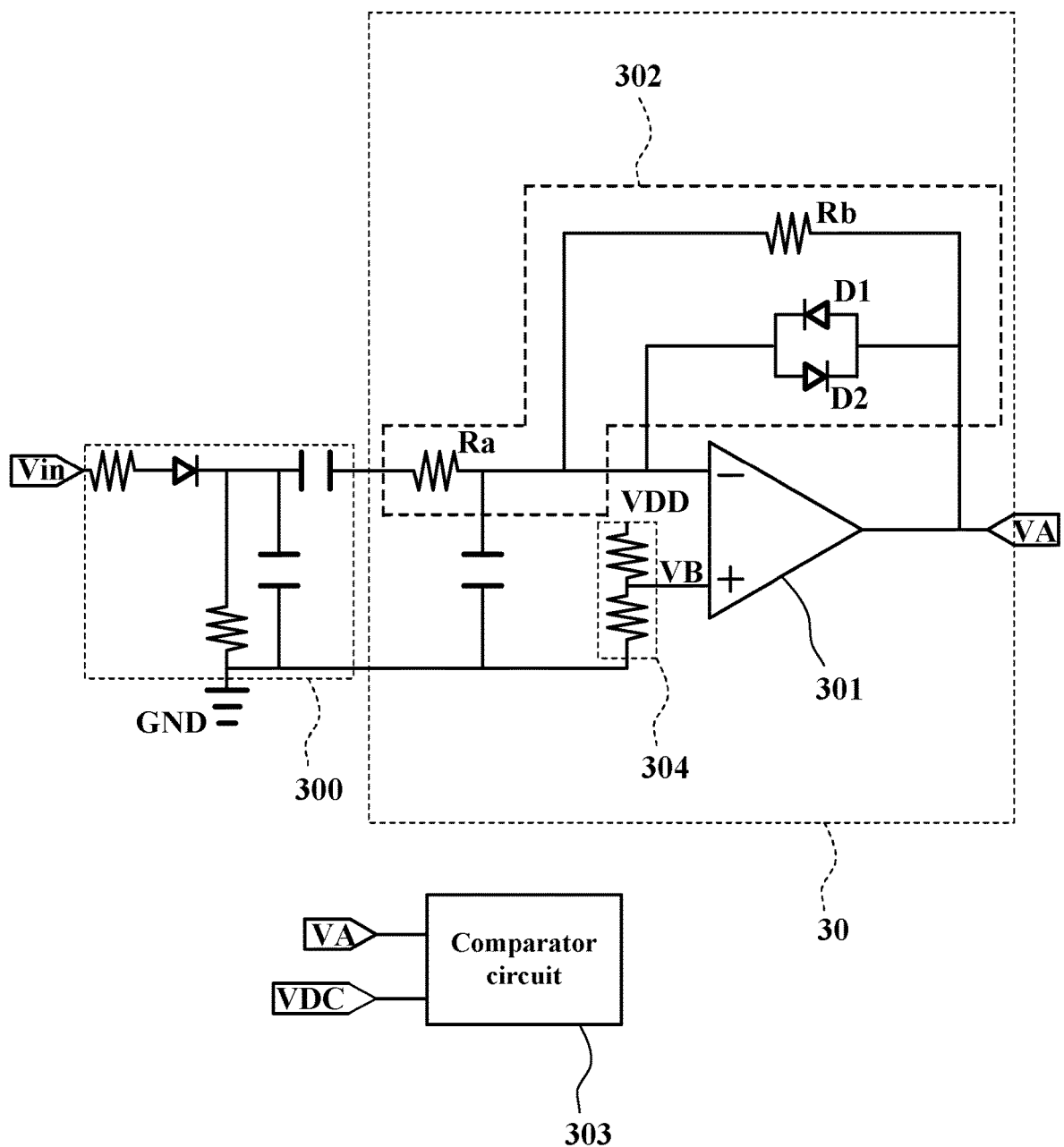
FIG. 3B illustrates a circuit diagram depicting a decoder 102 for a wireless charging transmitter according to a preferred embodiment of the present invention.

FIG. 3B illustrates a circuit diagram depicting a decoder 102 for a wireless charging transmitter according to a preferred embodiment of the present invention. Referring to FIG. 3B, in this embodiment, the voltage decoder circuit in FIG. 2 is adopted to serve as an example. The decoder for a wireless charging transmitter 102 includes a voltage sampling circuit 300, a signal limitation circuit 30 and a comparator circuit 303. The signal limitation circuit 30 includes an operational amplifier 301 and a gain limitation feedback circuit 302. The voltage sampling circuit 300 is coupled to one of nodes N1, N2 or N3 of the resonant circuit 100, for sampling the electrical signal Vin receiving from the coil of the resonant circuit 100. By the low pass filtering, DC blocking, and the like . . . of the voltage sampling circuit 300 the electrical signal which is removed the DC is sampled. The operational amplifier 301 includes a negative input terminal, a positive input terminal and an output terminal, wherein the negative input terminal of the operational amplifier 301 is coupled to one of node N1, N2 or N3 through the first resistor Ra and voltage sampling circuit 300. The positive input terminal of the operational amplifier 301 receives the DC bias VB from the voltage divider 304 which is implemented by two resistors. The output terminal of the operational amplifier 301 output an amplifying signal VA. The comparator circuit 303 receives the DC element VDC of the electrical signal Vin and the amplifying signal VA output from the output terminal of the operational amplifier 301 to obtain a decoded data.

The gain limitation feedback circuit 302 is coupled between the output terminal and the negative input terminal of the operational amplifier 301, for limiting the gain of the operational amplifier 301. The function of the gain limitation feedback circuit 302 is to let the operational amplifier 301 operate at higher gain when the swing of the amplifying signal VA between a upper threshold voltage and a lower threshold voltage, and to let the operational amplifier 301 operate at lower gain when the swing of the amplifying signal VA is greater than the upper threshold voltage or smaller than the lower threshold voltage. In this embodiment, the gain limitation feedback circuit 302 is implemented by the first resistor Ra, a second resistor Rb, the diode D1 and the diode D2. If the diodes D1 and D2 are ignored, the operational amplifier 301, the first resistor Ra and the second resistor Rb can be served as an inverting operational amplifier. Assuming the gain of the operational amplifier is sufficiently great, the gain of the inverting operational amplifier is determined by the first resistor Ra and the second resistor Rb. Generally, the gain is approximate to −Rb/Ra. Further, it is assumed the cut-in voltage of the diodes D1 and D2 are 1V. In this embodiment, if the swing of the amplifying signal VA is lower than 1V, the equivalent circuit of the feedback circuit is the first resistor Ra and the second resistor Rb. If the swing of the amplifying signal VA is greater than 1V, the diode D1 or the diode D2 would conduct, such that the feedback circuit is equivalent to short circuit. And then, the circuit is equivalent to a buffer, and the gain is −1.

It has benefit in this feedback mechanism. For example, when the wireless charging circuit is operated on the resonant frequency, the swing of the signal on node N1, N2 or N3 would be very large, and the noise would be also very large. If a general operational amplifier is adopted, the noise and the signal would be amplified. When the swing of the noise and the signal is sufficient large, the general operational amplifier would output the positive saturation voltage or the negative saturation voltage. Because the signal and the noise are amplified to be the positive saturation voltage or the negative saturation voltage, the post-stage circuit cannot identify the difference between the signal and the noise. Even if the debug mechanism is adopted, the decoding may easily fail. However, in the preferred embodiment of the present invention, the feedback adopts the gain limitation feedback circuit 302. When the swing of the signal is too large, the gain would be reduced, and when the swing of the signal is too small, the gain is increased. Thus, the dynamic range is increased. The comparator circuit 303 in the post-stage would not be misjudged. And, the successful decoding rate is increased.

Further, the in the abovementioned embodiment, the diode D1 and the diode D2 is for limiting the upper threshold voltage and the lower threshold voltage. If the upper threshold voltage or the lower threshold voltage is to be adjusted, multiple series diodes can be used. Moreover, if the loop gain of the diode D1 and diode D2 is to be adjusted, the series resistor can be added. Thus, the present invention is not limited thereto.

Figure 4:
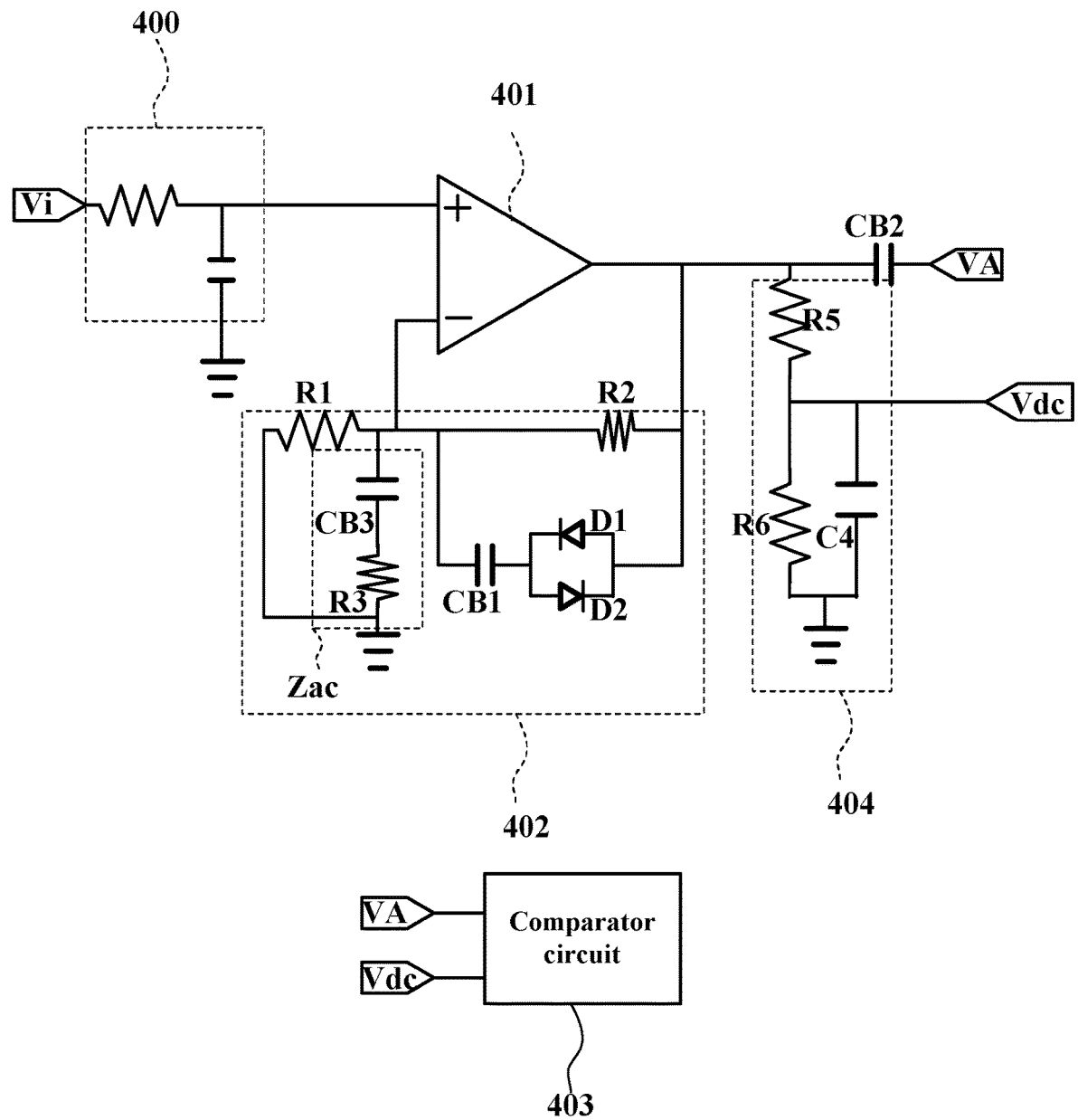
FIG. 4 illustrates a circuit diagram depicting a decoder 102 for a wireless charging transmitter according to a preferred embodiment of the present invention.

FIG. 4 illustrates a circuit diagram depicting a decoder 102 for a wireless charging transmitter according to a preferred embodiment of the present invention. Referring to FIG. 4, in this embodiment, the current decoder circuit is served as example. The decoder for a wireless charging transmitter 102 includes a low pass filter 400, an operational amplifier 401, a gain limitation feedback circuit 402, a comparator circuit 403 and a DC sampling circuit 404. Similarly, in this embodiment, the signal limitation circuit 30 is implemented by the operational amplifier 401 and the gain limitation feedback circuit 402. The positive input terminal of the operational amplifier 401 is coupled to the current sense resistor Rs through the low pass filter 400, for sampling the current input signal Vi. The gain limitation feedback circuit 402 is coupled to the output terminal and the negative input terminal of the operational amplifier 401, for limiting the gain of the operational amplifier 401. Similarly, the function of the gain limitation feedback circuit 402 is to let the operational amplifier 301 operate at higher gain when the swing of the amplifying signal VA between a upper threshold voltage and a lower threshold voltage, and to let the operational amplifier 301 operate at lower gain when the swing of the amplifying signal VA is greater than the upper threshold voltage or smaller than the lower threshold voltage.

However, in this embodiment, the operational amplifier 401 and the gain limitation feedback circuit 402 is not only for amplifying the AC element of the current input signal Vi, but also for amplifying the DC element Vdc of the current input signal Vi. Therefore, the output terminal of the operational amplifier 401 is coupled to the second DC blocking capacitor CB2 and a DC sampling circuit 404.

The gain limitation feedback circuit 402 includes a diode D1, a diode D2, a first DC blocking capacitor CB1, a first resistor R1, a second resistor R2 and an AC impedance circuit Zac. The anode of the diode D1 and the cathode of the diode D2 are coupled to the output terminal of the operational amplifier 401. The first terminal of the first DC blocking capacitor CB1 is coupled to the cathode of the diode D1 and the anode of the diode D2. The second terminal of the first DC blocking capacitor CB1 is coupled to the negative input terminal of the operational amplifier 401. The first terminal of the first resistor R1 is coupled to the common voltage GND. The second terminal of the first resistor R1 is coupled to the negative input terminal of the operational amplifier 401. The first terminal of the second resistor R2 is coupled to the second terminal of the first resistor R1. The second terminal of the second resistor R2 is coupled to the output terminal of the operational amplifier 401. The AC impedance circuit Zac is coupled between the common voltage GND and the negative input terminal of the operational amplifier 401. The AC impedance circuit Zac includes a third DC blocking capacitor CB3 and a third resistor R3.

Figure 5:
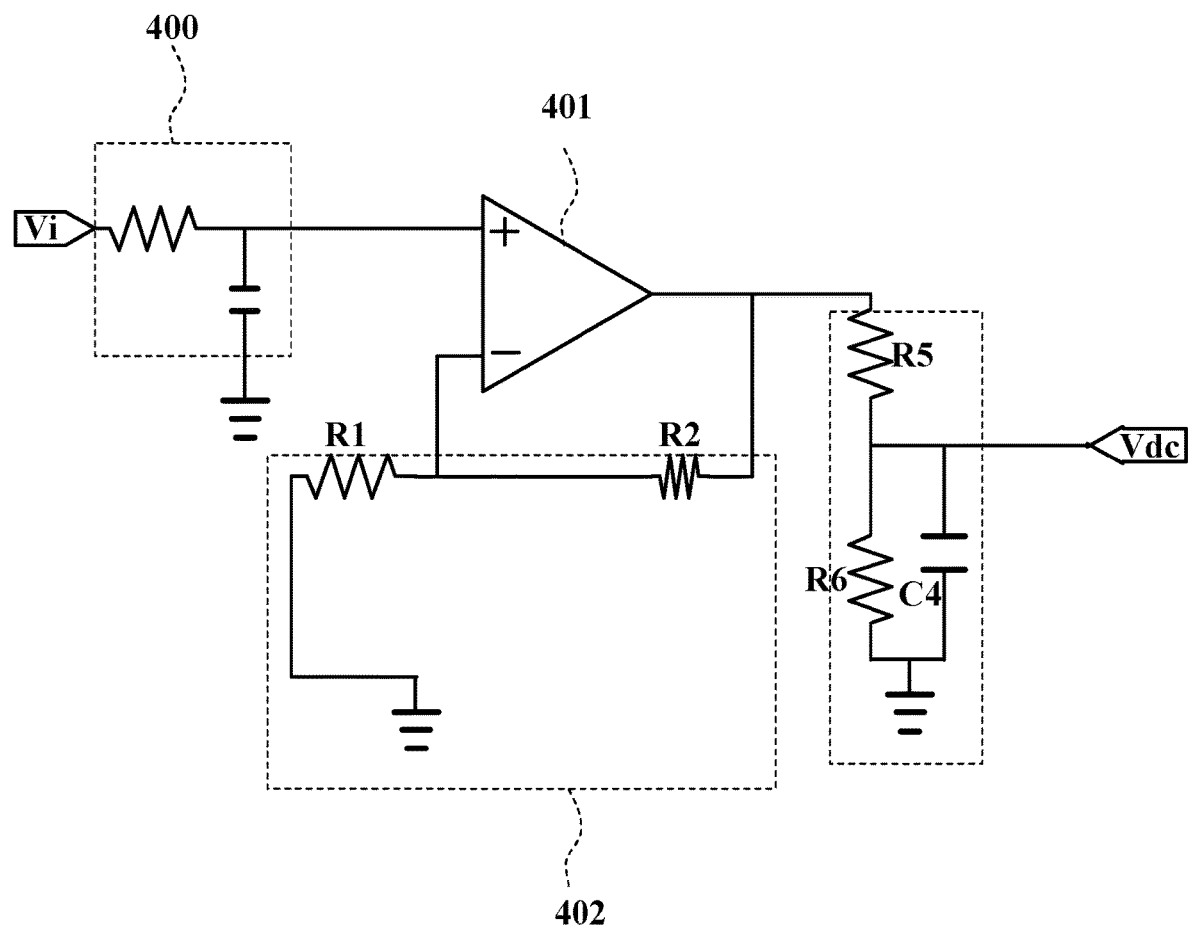
FIG. 5 illustrates a DC equivalent circuit diagram depicting a decoder 102 for a wireless charging transmitter in FIG. 4 according to a preferred embodiment of the present invention.

The circuit can be divided into a DC equivalent circuit and AC equivalent circuit. In the DC equivalent circuit, the DC blocking capacitors CB1, CB2 and CB3 is served as open-circuit, such that the DC equivalent circuit is illustrated as shown in FIG. 5. FIG. 5 illustrates a DC equivalent circuit diagram depicting a decoder 102 for a wireless charging transmitter in FIG. 4 according to a preferred embodiment of the present invention. Referring to FIG. 5, in this embodiment, the DC element of the current input signal Vi would be amplified by the gain (1+R2/R1). According to the voltage divider, which implemented by the fourth resistor R5 and fifth resistor R6, and the filter by the first capacitor C4, the DC element Vdc of the current input signal Vi is sampled.

Figure 6:
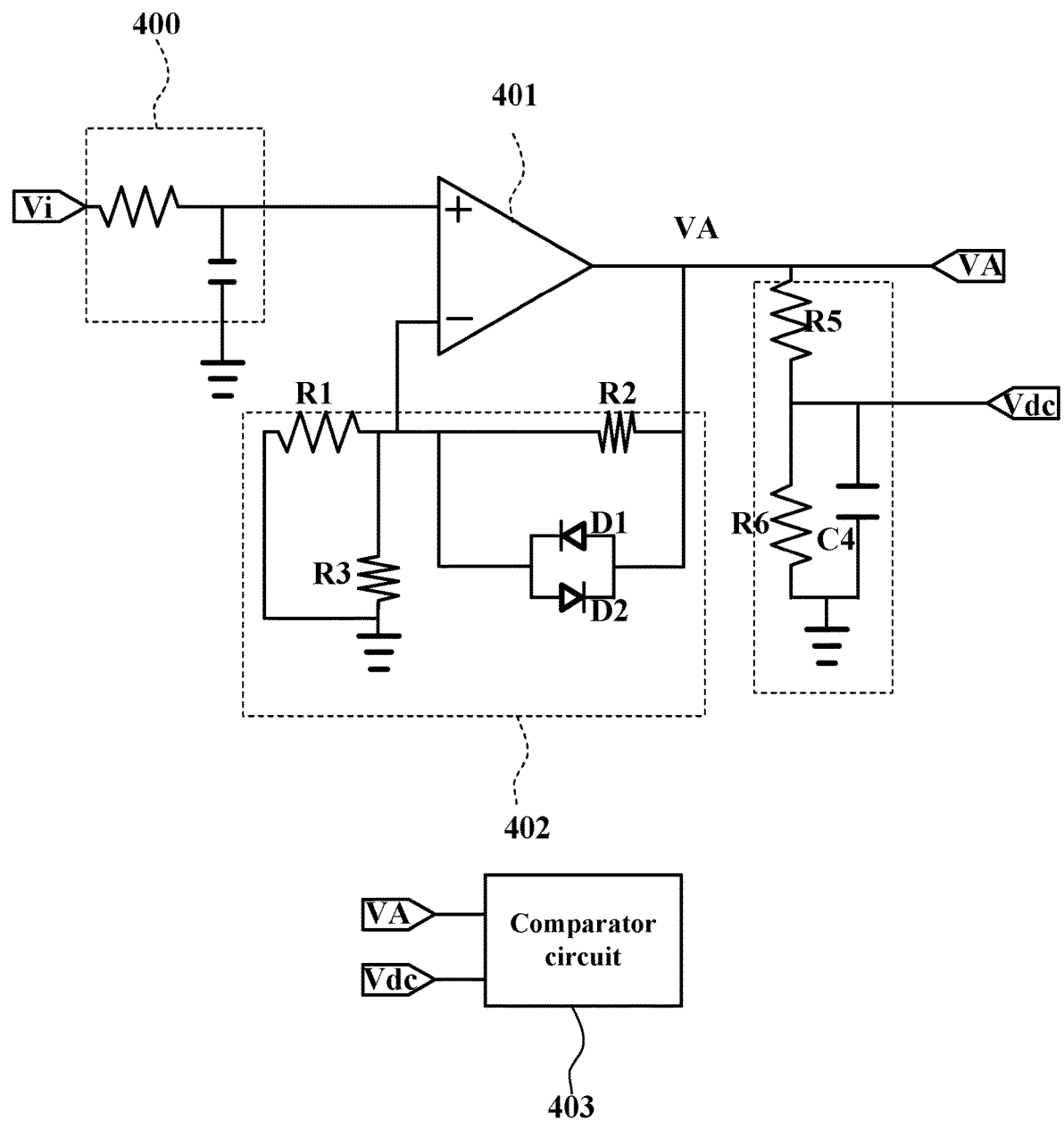
FIG. 6 illustrates an AC equivalent circuit diagram depicting a decoder 102 for a wireless charging transmitter in FIG. 4 according to a preferred embodiment of the present invention.

In the AC equivalent circuit, the DC blocking capacitors CB1, CB2 and CB3 is serve as short-circuit, such that the DC equivalent circuit is illustrated as shown in FIG. 6. FIG. 6 illustrates an AC equivalent circuit diagram depicting a decoder 102 for a wireless charging transmitter in FIG. 4 according to a preferred embodiment of the present invention. Referring to FIG. 6, similarly, in this embodiment, it is assumed that the cut-in voltage of diodes D1 and D2 are 1V. If the swing of the amplifying signal VA is lower than 1V, the gain of the equivalent circuit is [1+R2/(R1//R3)]=1+R2 (R1+R3)/R1*R3. If the swing of the amplifying signal VA is greater than 1V, the diode D1 or the diode D2 would conduct, such that the feedback circuit is equivalent to short circuit. And then, the circuit is equivalent to a buffer, and the gain is 1.

Figure 7:
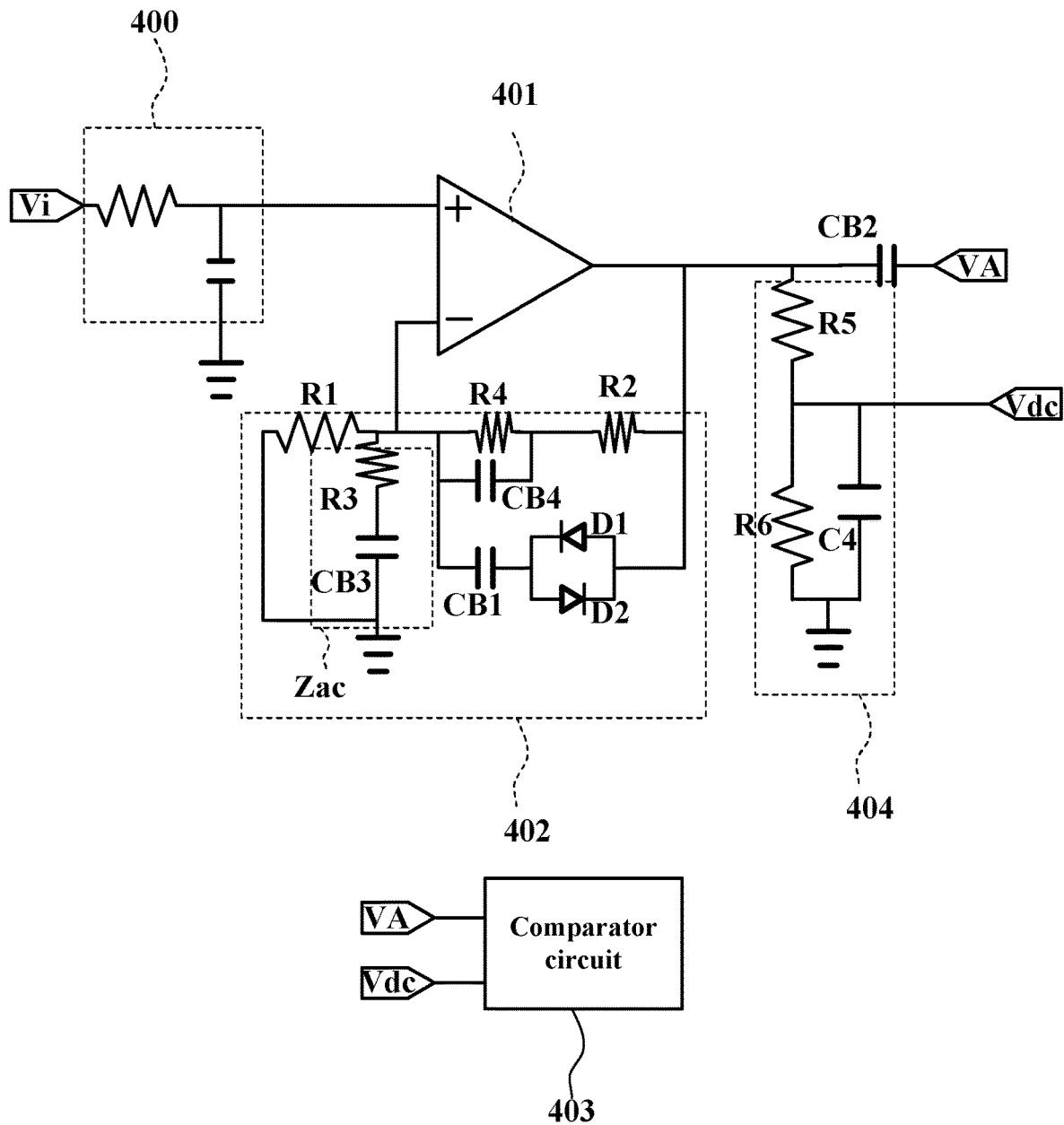
FIG. 7 illustrates a circuit diagram depicting a decoder 102 for a wireless charging transmitter according to a preferred embodiment of the present invention.

FIG. 7 illustrates a circuit diagram depicting a decoder 102 for a wireless charging transmitter according to a preferred embodiment of the present invention. Referring to FIG. 7, in this embodiment, a resistor R4 and a DC blocking capacitor CB4 is further added in the gain limitation feedback circuit 402. Moreover, the third resistor R3 and the third DC blocking capacitor CB3 of AC impedance circuit Zac are interchanged. The resistor R4 and the DC blocking capacitor CB4 can increase the flexibility of the adjustment of the AC gain and the DC gain. In addition, the position of the third resistor R3 and the position of the DC blocking capacitor CB3 of the AC impedance circuit Zac do not affect their function. The detail description thereof is omitted.

According to the abovementioned embodiment, the gain of the circuit can be adjusted according to the AC impedance circuit Zac, so the AC gain would be higher than the DC gain. Because the strength of the current input signal Vi is smaller than the strength of the voltage signal Vin from the voltage sampling circuit, the higher gain is required to obtain a greater signal for decoding. Similarly, people having ordinary skill in the art can use the same way to adjust AC gain and DC gain. The present invention is not limited thereto.

In addition, when the signal is too large, such as the wireless charging transmitter is operated at the resonant frequency or the frequency close to the resonant frequency, the signal and the noise would increase at the same time.

If a general operational amplifier is adopted, the noise and the signal would be amplified and the general operational amplifier would output the positive saturation voltage or the negative saturation voltage, and the decoding may easily fail. In the operation of the gain limitation feedback circuit, if the swing lower than a preset swing, the signal would be amplified. If the swing exceeds a preset swing, the signal would be amplified by a lower gain, such as 1 or −1 in the abovementioned embodiments. Therefore, the noise would not become too large or saturation. And the successful decoding rate is increased.

Further, in the abovementioned embodiment, series resistor can be added to the unidirectional conduction element (such as the diodes) to implement changing the gain when the swing is higher than a preset swing. If the upper threshold voltage or the lower threshold voltage is to be adjusted, multiple series unidirectional conduction elements can be used or the different unidirectional conduction element can be adopted. Thus, the present invention is not limited thereto.

Figure 8:
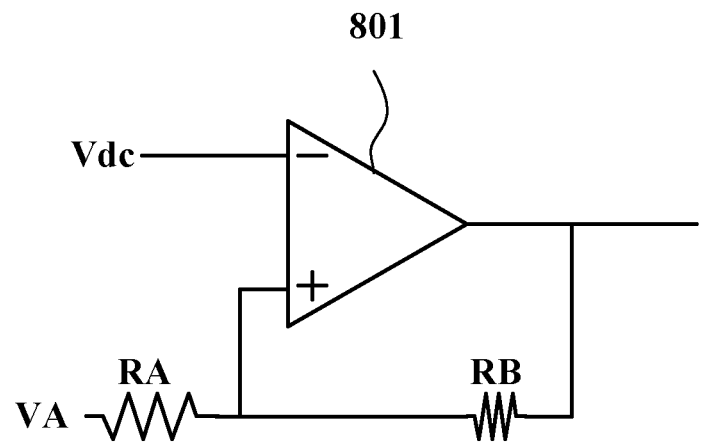
FIG. 8 illustrates a circuit diagram depicting the comparator 403 of the decoder 102 for a wireless charging transmitter according to a preferred embodiment of the present invention.

FIG. 8 illustrates a circuit diagram depicting the comparator circuit 403 of the decoder 102 for a wireless charging transmitter according to a preferred embodiment of the present invention. Referring to FIG. 8, the comparator circuit in general can adopt the comparator circuit in FIG. 8. The comparator circuit includes an amplifier 801, a feedback resistor RA and a feedback resistor RB. The comparator circuit compares the DC element Vdc of the input signal Vi and the amplifying signal VA to output decoded data.

Figure 9:
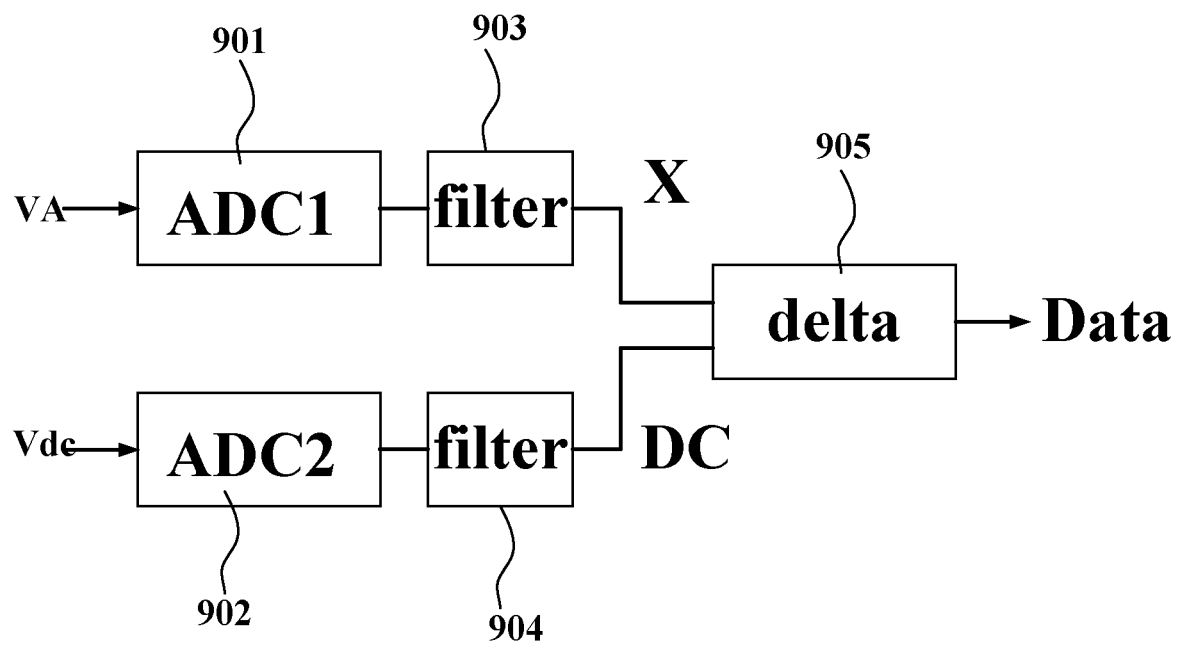
FIG. 9 illustrates a circuit block diagram depicting the comparator circuit 403 of the decoder 102 for a wireless charging transmitter according to a preferred embodiment of the present invention.
Figure 10:
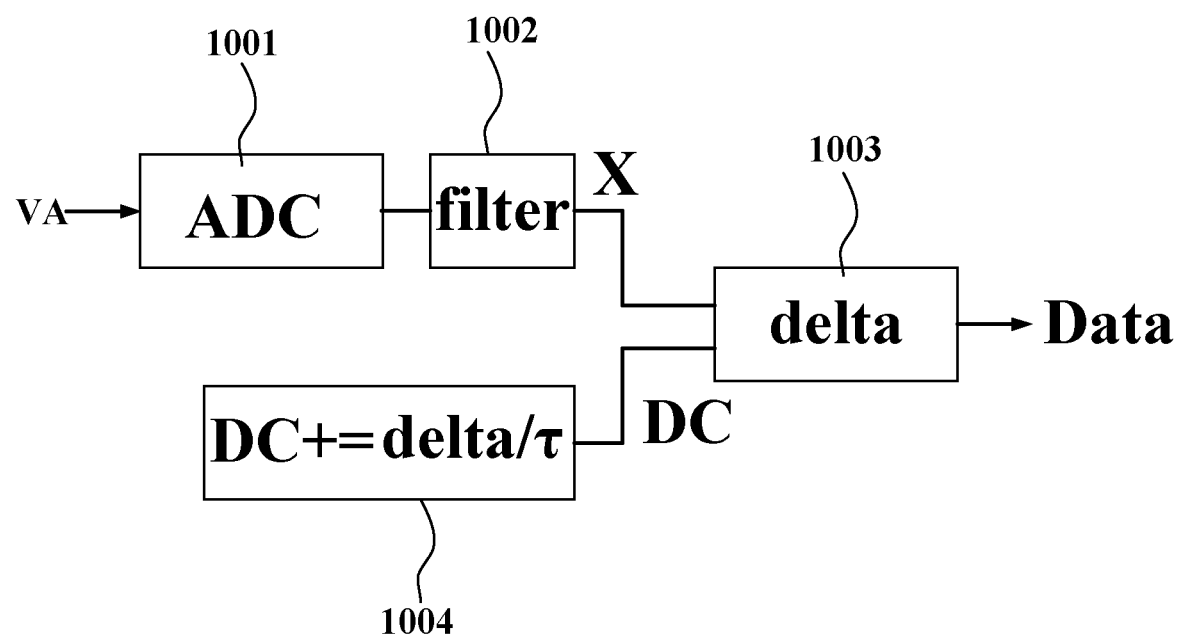
FIG. 10 illustrates a circuit block diagram depicting the comparator circuit 403 of the decoder 102 for a wireless charging transmitter according to a preferred embodiment of the present invention.

FIG. 9 illustrates a circuit block diagram depicting the comparator circuit 403 of the decoder 102 for a wireless charging transmitter according to a preferred embodiment of the present invention. Referring to FIG. 9, similarly, the comparator 403 includes the first analog-to-digital converter (ADC) 901, a second ADC 902, a first digital filter 903, a second digital filter 904 and a judgment circuit 905. The first and the second ADC 901, 902 respectively convert the DC element Vdc of the input signal Vi and the amplifying signal VA into digital signals. And then the digital filters 903, 904 respectively filter the noises out, and obtain the digital value X of the amplifying signal VA and the digital value DC of the DC element Vdc of the input signal Vi. At last, the judgment circuit 905 subtracts the digital value X and the digital value DC to obtain the judgment difference delta, wherein the judgment difference delta is equal to X−DC. When the judgment difference delta is greater than 0, the first logic is output (such as logic 1); when the judgment difference delta is smaller than 0, the second logic is output (such as logic 0);

FIG. 10 illustrates a circuit block diagram depicting the comparator circuit 403 of the decoder 102 for a wireless charging transmitter according to a preferred embodiment of the present invention. Referring to FIG. 10, similarly, the comparator circuit 403 includes an ADC 1001, a digital filter 1002, an operation circuit 1004 and a judgment circuit 1003. The operation circuit 1004 respectively divides the judgment difference delta and the digital value X by the time constant τ to obtain the digital value DC of the DC element Vdc of the input signal Vi. And then the judgment circuit 1003 outputs the decoded data according to the value X−DC.

Figure 11:
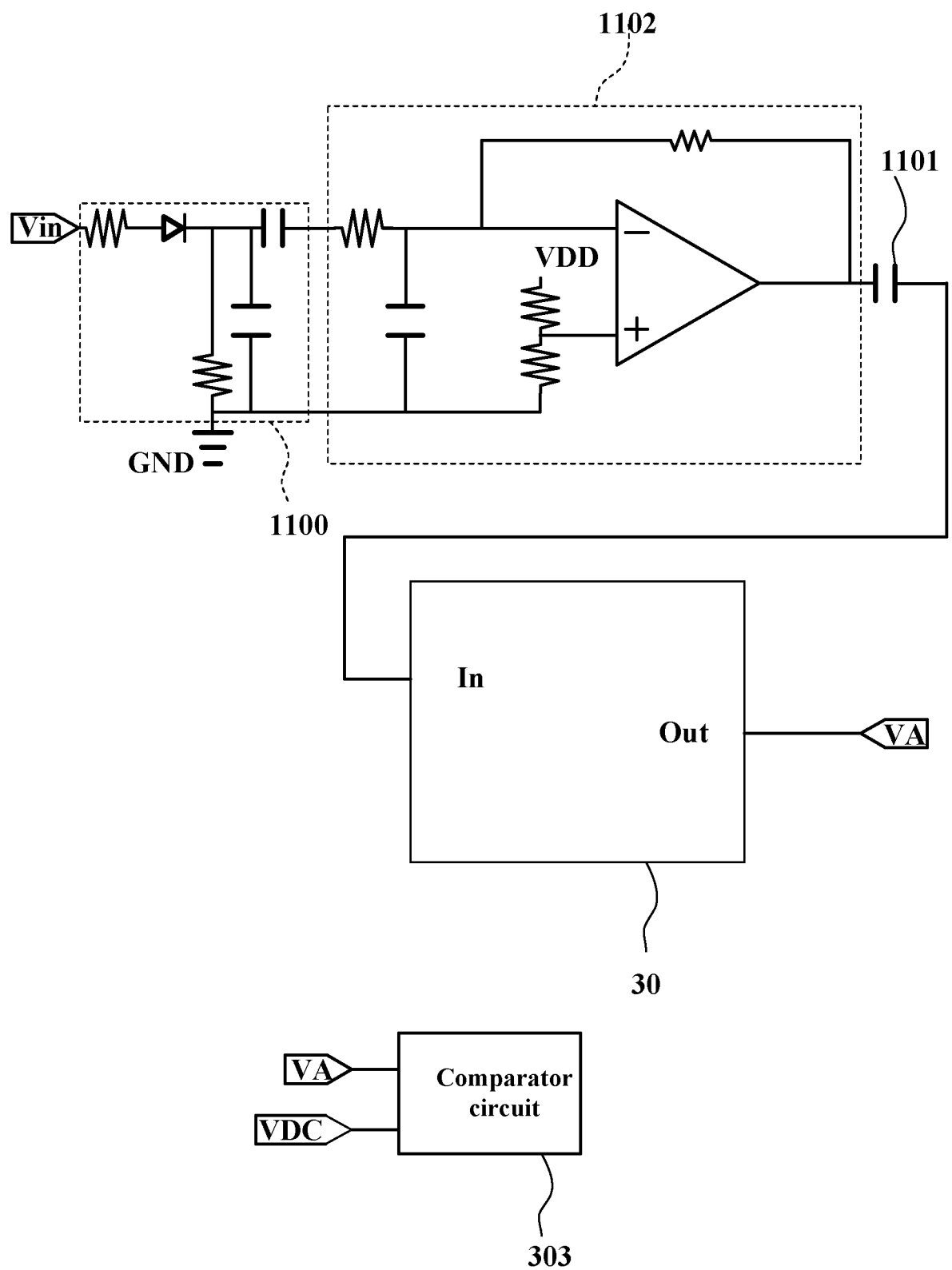
FIG. 11 illustrates a circuit diagram depicting the decoder 102 for a wireless charging transmitter according to a preferred embodiment of the present invention.

FIG. 11 illustrates a circuit diagram depicting the decoder 102 for a wireless charging transmitter according to a preferred embodiment of the present invention. Referring to FIG. 11, in this embodiment, the current decoder circuit in FIG. 1 is served as example. The decoder for a wireless charging transmitter 102 includes a low pass filter 1100, a DC blocking capacitor 1101, an operational amplifier 1102, a signal limitation circuit 30 and a comparator circuit 303, wherein the signal limitation circuit 30 can be implemented by the circuit disclosed in FIG. 3A. Because the current sense signal is weaker, an extra operational amplifier 1101 is adopted. The operational amplifier 1101 initially amplifies the signal before the signal entering the signal limitation circuit 30. Because the basic operation is similar to the abovementioned embodiment, the detail description thereof is omitted.

In summary, the essence of the present invention is to change the gain of the circuit. When the swing of the signal is under a preset swing, the gain of the circuit adopts a original gain, and when the swing of the signal is greater than the preset swing, the gain is limited. Therefore, the operational amplifier has higher dynamic range. And the amplifying signal still has the characteristic of the original signal. Thus, the successful decoding rate is increased.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A decoder for wireless charging transmitter, comprising:
    an operational amplifier, comprising a first input terminal, a second input terminal and an output terminal, wherein the first input terminal of operational amplifier is coupled to a charge detecting terminal of a wireless charging transmitter, and the output terminal of operational amplifier outputs an amplifying signal;
    a gain limitation feedback circuit, coupled to the output terminal of the operational amplifier, and selectively coupled to the first input terminal or the second terminal of the operational amplifier, for limiting a gain of the operational amplifier, wherein the operational amplifier is operated at a first gain when a swing of the amplifying signal is between a first threshold voltage and a second threshold voltage, wherein the operational amplifier is operated at a second gain when the swing of the amplifying signal is greater than the first threshold voltage or smaller than a second threshold voltage; and
    a comparator circuit, for receiving a sampled DC voltage and the amplifying signal, and obtaining a decoded data according to the sampled DC voltage and the amplifying signal.

2. The decoder for wireless charging transmitter according to claim 1, wherein the gain limitation feedback circuit comprises:
    a first unidirectional conduction element, comprising a first terminal and a second terminal, wherein the first terminal of the first unidirectional conduction element is coupled to the first input terminal of the operational amplifier, and the second terminal of the first unidirectional conduction element is coupled to the output terminal of the operational amplifier, wherein the first unidirectional conduction element limits current flowing from the first terminal of the first unidirectional conduction element to the second terminal of the first unidirectional conduction element;
    a second unidirectional conduction element, comprising a first terminal and a second terminal, wherein the second terminal of the second unidirectional conduction element is coupled to the first input terminal of the operational amplifier, and the first terminal of the second unidirectional conduction element is coupled to the output terminal of the operational amplifier, wherein the second unidirectional conduction element limits current flowing from the first terminal of the second unidirectional conduction element to the second terminal of the second unidirectional conduction element;
    a first resistor, comprising a first terminal and a second terminal, wherein the first terminal of the first resistor is coupled to the charge detecting terminal, and the second terminal of the first resistor is coupled to the first input terminal of the operational amplifier; and
    a second resistor, comprising a first terminal and a second terminal, wherein the first terminal of the second resistor is coupled to the first input terminal of the operational amplifier, and the second terminal of the second resistor is coupled to the output terminal of the operational amplifier,
    wherein the first unidirectional conduction element has a first cut-in voltage, and the second unidirectional conduction element has a second cut-in voltage, wherein the first cut-in voltage and the second cut-in voltage are respectively for determining the first threshold voltage and the second threshold voltage,
    wherein the second input terminal of the operational amplifier is coupled to a DC bias voltage.

3. The decoder for wireless charging transmitter according to claim 1, further comprising:
    a current sense circuit, coupled to the first input terminal of the operational amplifier, and the charge detecting terminal.

4. The decoder for wireless charging transmitter according to claim 1, wherein the gain limitation feedback circuit comprises:
    a first DC blocking capacitor, comprising a first terminal and a second terminal, wherein the first terminal of the first DC blocking capacitor is coupled to the second input terminal of the operational amplifier;
    a first unidirectional conduction element, comprising a first terminal and a second terminal, wherein the first terminal of the first unidirectional conduction element is coupled to the second terminal of the first DC blocking capacitor, and the second terminal of the first unidirectional conduction element is coupled to the output terminal of the operational amplifier, wherein the first unidirectional conduction element limits current flowing from the first terminal of the first unidirectional conduction element to the second terminal of the first unidirectional conduction element;
    a second unidirectional conduction element, comprising a first terminal and a second terminal, wherein the second terminal of the second unidirectional conduction element is coupled to the second terminal of the first DC blocking capacitor, and the first terminal of the second unidirectional conduction element is coupled to the output terminal of the operational amplifier, wherein the second unidirectional conduction element limits current flowing from the first terminal of the second unidirectional conduction element to the second terminal of the second unidirectional conduction element;
    a first resistor, comprising a first terminal and a second terminal, wherein the first terminal of the first resistor is coupled to a common voltage, and the second terminal of the first resistor is coupled to the second input terminal of the operational amplifier;
    a second resistor, comprising a first terminal and a second terminal, wherein the first terminal of the second resistor is coupled to the second terminal of the first resistor, and the second terminal of the second resistor is coupled to the output terminal of the operational amplifier; and an AC impedance circuit, comprising a first terminal and a second terminal, wherein the first terminal of the AC impedance circuit is coupled to the second input terminal of the operational amplifier, and the second terminal of the AC impedance circuit is coupled to the common voltage, wherein the first resistor and the second resistor determines a DC gain;

wherein the first resistor, the second resistor and the AC impedance circuit determines the first gain;

wherein the first unidirectional conduction element has a first cut-in voltage, and the second unidirectional conduction element has a second cut-in voltage, wherein the first cut-in voltage and the second cut-in voltage respectively determines the first threshold voltage and the second threshold voltage.

5. The decoder for wireless charging transmitter according to claim 4, further comprising:
a second DC blocking capacitor, comprising a first terminal and a second terminal, wherein the first terminal of the second DC blocking capacitor is coupled to the output terminal of the operational amplifier, and the second terminal of the second DC blocking capacitor outputs the amplifying signal; and
a DC sampling circuit, comprising an input terminal and an output terminal, wherein the input terminal of the DC sampling circuit is coupled to the output terminal of the operational amplifier, the output terminal of the DC sampling circuit outputs the sampled DC voltage.

6. The decoder for wireless charging transmitter according to claim 5, wherein the DC sampling circuit comprises:
a fourth resistor, comprising a first terminal and a second terminal, wherein the first terminal of the fourth resistor is coupled to the output terminal of the operational amplifier;
a fifth resistor, comprising a first terminal and a second terminal, wherein the first terminal of the fifth resistor is coupled to the second terminal of the fourth resistor, and the second terminal of the fifth resistor is coupled to the common voltage; and
a first capacitor, comprising a first terminal and a second terminal, wherein the first terminal of the first capacitor is coupled to the second terminal of the fourth resistor, and the second terminal of the first capacitor is coupled to the common voltage.

7. The decoder for wireless charging transmitter according to claim 4, wherein the AC impedance circuit comprises:
a third resistor, comprising a first terminal and a second terminal, wherein the first terminal of the third resistor is coupled to the second input terminal of the operational amplifier; and
a third DC blocking capacitor, comprising a first terminal and a second terminal, wherein the first terminal of the third DC blocking capacitor is coupled to the second terminal of the third resistor, and the second terminal of the third DC blocking capacitor is coupled to the common voltage.

8. A wireless charging transmitter, comprising:
a wireless transmitter circuit, for transmitting a wireless charge power signal and receiving a receiving signal, comprising a charge detecting terminal;
a decoder for wireless charging transmitter, comprising:
an operational amplifier, comprising a first input terminal, a second input terminal and an output terminal, wherein the first input terminal of operational amplifier is coupled to a charge detecting terminal of a wireless charging transmitter, and the output terminal of operational amplifier outputs an amplifying signal;
a gain limitation feedback circuit, coupled to the output terminal of the operational amplifier, and selectively coupled to the first input terminal or the second terminal of the operational amplifier, for limiting a gain of the operational amplifier, wherein the operational amplifier is operated at a first gain when a swing of the amplifying signal is between a first threshold voltage and a second threshold voltage, wherein the operational amplifier is operated at a second gain when the swing of the amplifying signal is greater than the first threshold voltage or smaller than a second threshold voltage; and
a comparator circuit, for receiving a sampled DC voltage and the amplifying signal, and obtaining a decoded data according to the sampled DC voltage and the amplifying signal.

9. The wireless charging transmitter according to claim 8, wherein the gain limitation feedback circuit comprises:
a first unidirectional conduction element, comprising a first terminal and a second terminal, wherein the first terminal of the first unidirectional conduction element is coupled to the first input terminal of the operational amplifier, and the second terminal of the first unidirectional conduction element is coupled to the output terminal of the operational amplifier, wherein the first unidirectional conduction element limits current flowing from the first terminal of the first unidirectional conduction element to the second terminal of the first unidirectional conduction element;
a second unidirectional conduction element, comprising a first terminal and a second terminal, wherein the second terminal of the second unidirectional conduction element is coupled to the first input terminal of the operational amplifier, and the first terminal of the second unidirectional conduction element is coupled to the output terminal of the operational amplifier, wherein the second unidirectional conduction element limits current flowing from the first terminal of the second unidirectional conduction element to the second terminal of the second unidirectional conduction element;
a first resistor, comprising a first terminal and a second terminal, wherein the first terminal of the first resistor is coupled to the charge detecting terminal, and the second terminal of the first resistor is coupled to the first input terminal of the operational amplifier; and
a second resistor, comprising a first terminal and a second terminal, wherein the first terminal of the second resistor is coupled to the first input terminal of the operational amplifier, and the second terminal of the second resistor is coupled to the output terminal of the operational amplifier,
wherein the first unidirectional conduction element has a first cut-in voltage, and the second unidirectional conduction element has a second cut-in voltage, wherein the first cut-in voltage and the second cut-in voltage are respectively for determining the first threshold voltage and the second threshold voltage,
wherein the second input terminal of the operational amplifier is coupled to a DC bias voltage.

10. The wireless charging transmitter according to claim 8, further comprising:

a current sense circuit, coupled to the first input terminal of the operational amplifier, and the charge detecting terminal.

11. The wireless charging transmitter according to claim 1, wherein the gain limitation feedback circuit comprises:
a first DC blocking capacitor, comprising a first terminal and a second terminal, wherein the first terminal of the first DC blocking capacitor is coupled to the second input terminal of the operational amplifier;
a first unidirectional conduction element, comprising a first terminal and a second terminal, wherein the first terminal of the first unidirectional conduction element is coupled to the second terminal of the first DC blocking capacitor, and the second terminal of the first unidirectional conduction element is coupled to the output terminal of the operational amplifier, wherein the first unidirectional conduction element limits current flowing from the first terminal of the first unidirectional conduction element to the second terminal of the first unidirectional conduction element;
a second unidirectional conduction element, comprising a first terminal and a second terminal, wherein the second terminal of the second unidirectional conduction element is coupled to the second terminal of the first DC blocking capacitor, and the first terminal of the second unidirectional conduction element is coupled to the output terminal of the operational amplifier, wherein the second unidirectional conduction element limits current flowing from the first terminal of the second unidirectional conduction element to the second terminal of the second unidirectional conduction element;
a first resistor, comprising a first terminal and a second terminal, wherein the first terminal of the first resistor is coupled to a common voltage, and the second terminal of the first resistor is coupled to the second input terminal of the operational amplifier;
a second resistor, comprising a first terminal and a second terminal, wherein the first terminal of the second resistor is coupled to the second terminal of the first resistor, and the second terminal of the second resistor is coupled to the output terminal of the operational amplifier; and
an AC impedance circuit, comprising a first terminal and a second terminal, wherein the first terminal of the AC impedance circuit is coupled to the second input terminal of the operational amplifier, and the second terminal of the AC impedance circuit is coupled to the common voltage,
wherein the first resistor and the second resistor determines a DC gain;
wherein the first resistor, the second resistor and the AC impedance circuit determines the first gain;
wherein the first unidirectional conduction element has a first cut-in voltage, and the second unidirectional conduction element has a second cut-in voltage, wherein the first cut-in voltage and the second cut-in voltage respectively determines the first threshold voltage and the second threshold voltage.

12. The wireless charging transmitter according to claim 11, further comprising:
a second DC blocking capacitor, comprising a first terminal and a second terminal, wherein the first terminal of the second DC blocking capacitor is coupled to the output terminal of the operational amplifier, and the second terminal of the second DC blocking capacitor outputs the amplifying signal; and
a DC sampling circuit, comprising an input terminal and an output terminal, wherein the input terminal of the DC sampling circuit is coupled to the output terminal of the operational amplifier, the output terminal of the DC sampling circuit outputs the sampled DC voltage.

13. The wireless charging transmitter according to claim 12, wherein the DC sampling circuit comprises:
a fourth resistor, comprising a first terminal and a second terminal, wherein the first terminal of the fourth resistor is coupled to the output terminal of the operational amplifier;
a fifth resistor, comprising a first terminal and a second terminal, wherein the first terminal of the fifth resistor is coupled to the second terminal of the fourth resistor, and the second terminal of the fifth resistor is coupled to the common voltage; and
a first capacitor, comprising a first terminal and a second terminal, wherein the first terminal of the first capacitor is coupled to the second terminal of the fourth resistor, and the second terminal of the first capacitor is coupled to the common voltage.

14. The wireless charging transmitter according to claim 11, wherein the AC impedance circuit comprises:
a third resistor, comprising a first terminal and a second terminal, wherein the first terminal of the third resistor is coupled to the second input terminal of the operational amplifier; and
a third DC blocking capacitor, comprising a first terminal and a second terminal, wherein the first terminal of the third DC blocking capacitor is coupled to the second terminal of the third resistor, and the second terminal of the third DC blocking capacitor is coupled to the common voltage.

15. A decoder for wireless charging transmitter, comprising:
a signal limitation circuit, comprising an input terminal and an output terminal, wherein the input terminal of the signal limitation circuit is coupled to a charge detecting terminal of a wireless charging transmitter, and the output terminal of the signal limitation circuit outputs an amplifying signal, wherein the signal limitation circuit operates at a first gain when a swing of the amplifying signal is between the first threshold voltage and the second threshold voltage, wherein the signal limitation circuit operates at a second gain when the swing of the amplifying signal is greater than the first threshold voltage or smaller than the second threshold voltage, wherein the second gain is smaller than the first gain; and
a comparator circuit, for receiving a sampled DC voltage and the amplifying signal, and obtaining a decoded data according to the sampled DC voltage and the amplifying signal.

16. The decoder for wireless charging transmitter according to claim 15, wherein the signal limitation circuit comprises:
an operational amplifier, comprising a first input terminal, a second input terminal and an output terminal, wherein the first input terminal of operational amplifier is coupled to a charge detecting terminal of a wireless charging transmitter, and the output terminal of operational amplifier outputs an amplifying signal; and
a gain limitation feedback circuit, coupled to the output terminal of the operational amplifier, and selectively coupled to the first input terminal or the second terminal of the operational amplifier, for limiting a gain of the operational amplifier, wherein the operational amplifier is operated at a first gain when a swing of the amplifying signal is between a first threshold voltage and a second threshold voltage, wherein the operational amplifier is operated at a second gain when the swing of the amplifying signal is greater than the first threshold voltage or smaller than a second threshold voltage.

17. The decoder for wireless charging transmitter according to claim 16, wherein the gain limitation feedback circuit comprises:
a first unidirectional conduction element, comprising a first terminal and a second terminal, wherein the first terminal of the first unidirectional conduction element is coupled to the first input terminal of the operational amplifier, and the second terminal of the first unidirectional conduction element is coupled to the output terminal of the operational amplifier, wherein the first unidirectional conduction element limits current flowing from the first terminal of the first unidirectional conduction element to the second terminal of the first unidirectional conduction element;
a second unidirectional conduction element, comprising a first terminal and a second terminal, wherein the second terminal of the second unidirectional conduction element is coupled to the first input terminal of the operational amplifier, and the first terminal of the second unidirectional conduction element is coupled to the output terminal of the operational amplifier, wherein the second unidirectional conduction element limits current flowing from the first terminal of the second unidirectional conduction element to the second terminal of the second unidirectional conduction element;
a first resistor, comprising a first terminal and a second terminal, wherein the first terminal of the first resistor is coupled to the charge detecting terminal, and the second terminal of the first resistor is coupled to the first input terminal of the operational amplifier; and
a second resistor, comprising a first terminal and a second terminal, wherein the first terminal of the second resistor is coupled to the first input terminal of the operational amplifier, and the second terminal of the second resistor is coupled to the output terminal of the operational amplifier,
wherein the first unidirectional conduction element has a first cut-in voltage, and the second unidirectional conduction element has a second cut-in voltage, wherein the first cut-in voltage and the second cut-in voltage are respectively for determining the first threshold voltage and the second threshold voltage,
wherein the second input terminal of the operational amplifier is coupled to a DC bias voltage.

18. The decoder for wireless charging transmitter according to claim 16, wherein the gain limitation feedback circuit comprises:
a first DC blocking capacitor, comprising a first terminal and a second terminal, wherein the first terminal of the first DC blocking capacitor is coupled to the second input terminal of the operational amplifier;
a first unidirectional conduction element, comprising a first terminal and a second terminal, wherein the first terminal of the first unidirectional conduction element is coupled to the second terminal of the first DC blocking capacitor, and the second terminal of the first unidirectional conduction element is coupled to the output terminal of the operational amplifier, wherein the first unidirectional conduction element limits current flowing from the first terminal of the first unidirectional conduction element to the second terminal of the first unidirectional conduction element;
a second unidirectional conduction element, comprising a first terminal and a second terminal, wherein the second terminal of the second unidirectional conduction element is coupled to the second terminal of the first DC blocking capacitor, and the first terminal of the second unidirectional conduction element is coupled to the output terminal of the operational amplifier, wherein the second unidirectional conduction element limits current flowing from the first terminal of the second unidirectional conduction element to the second terminal of the second unidirectional conduction element;
a first resistor, comprising a first terminal and a second terminal, wherein the first terminal of the first resistor is coupled to a common voltage, and the second terminal of the first resistor is coupled to the second input terminal of the operational amplifier;
a second resistor, comprising a first terminal and a second terminal, wherein the first terminal of the second resistor is coupled to the second terminal of the first resistor, and the second terminal of the second resistor is coupled to the output terminal of the operational amplifier; and
an AC impedance circuit, comprising a first terminal and a second terminal, wherein the first terminal of the AC impedance circuit is coupled to the second input terminal of the operational amplifier, and the second terminal of the AC impedance circuit is coupled to the common voltage,
wherein the first resistor and the second resistor determines a DC gain;
wherein the first resistor, the second resistor and the AC impedance circuit determines the first gain;
wherein the first unidirectional conduction element has a first cut-in voltage, and the second unidirectional conduction element has a second cut-in voltage, wherein the first cut-in voltage and the second cut-in voltage respectively determines the first threshold voltage and the second threshold voltage.

19. The decoder for wireless charging transmitter according to claim 18, wherein the AC impedance circuit comprises:
a third resistor, comprising a first terminal and a second terminal, wherein the first terminal of the third resistor is coupled to the second input terminal of the operational amplifier; and
a third DC blocking capacitor, comprising a first terminal and a second terminal, wherein the first terminal of the third DC blocking capacitor is coupled to the second terminal of the third resistor, and the second terminal of the third DC blocking capacitor is coupled to the common voltage.

20. The decoder for wireless charging transmitter according to claim 18, further comprising:
a second DC blocking capacitor, comprising a first terminal and a second terminal, wherein the first terminal of the second DC blocking capacitor is coupled to the output terminal of the operational amplifier, and the second terminal of the second DC blocking capacitor outputs the amplifying signal; and
a DC sampling circuit, comprising an input terminal and an output terminal, wherein the input terminal of the DC sampling circuit is coupled to the output terminal of the operational amplifier, the output terminal of the DC sampling circuit outputs the sampled DC voltage.

\* \* \* \* \*